(12) United States Patent
Chen et al.

(10) Patent No.: US 11,037,504 B2
(45) Date of Patent: Jun. 15, 2021

(54) PIXEL ARRAY SUBSTRATE

(71) Applicant: Au Optronics Corporation, Hsinchu (TW)

(72) Inventors: Ming-Yao Chen, Hsinchu (TW); Shu-Wen Tzeng, Hsinchu (TW); Hsin-Lin Hu, Hsinchu (TW); Jui-Chi Lo, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/840,435

(22) Filed: Apr. 5, 2020

(65) Prior Publication Data

US 2021/0142731 A1 May 13, 2021

(30) Foreign Application Priority Data

Nov. 8, 2019 (TW) ................... 108140713

(51) Int. Cl.
*G09G 3/36* (2006.01)
*G09G 3/3266* (2016.01)
*G09G 3/3275* (2016.01)
*H01L 27/32* (2006.01)

(52) U.S. Cl.
CPC ......... *G09G 3/3266* (2013.01); *G09G 3/3275* (2013.01); *G09G 3/3677* (2013.01); *G09G 3/3688* (2013.01); *H01L 27/3248* (2013.01); *H01L 27/3272* (2013.01); *H01L 27/3276* (2013.01)

(58) Field of Classification Search
CPC .. G09G 3/32; G09G 3/36; G09G 3/30; G09G 5/00; H01L 27/32; G06F 3/041; G06F 3/045; G06F 3/038
See application file for complete search history.

(56) References Cited

U.S. PATENT DOCUMENTS

| 9,558,391 | B2 | 1/2017 | Cheng et al. |
| 9,791,972 | B2 | 10/2017 | Kurasawa et al. |
| 10,048,795 | B2 | 8/2018 | Lee et al. |
| 10,127,426 | B2 | 11/2018 | Hsieh et al. |
| 2011/0141318 | A1* | 6/2011 | Lee ........................ H04N 5/369 348/240.2 |
| 2015/0242040 | A1 | 8/2015 | Gu et al. |
| 2015/0268795 | A1 | 9/2015 | Kurasawa et al. |

(Continued)

FOREIGN PATENT DOCUMENTS

| CN | 105045446 | 11/2015 |
| CN | 205068352 | 3/2016 |

(Continued)

*Primary Examiner* — Pegeman Karimi
(74) *Attorney, Agent, or Firm* — JCIPRNET

(57) ABSTRACT

A pixel array substrate including a substrate, a plurality of display pixels, a plurality of sensing pixels, and a read-out circuit is provided. The substrate includes a first region and a second region. The second region is located between the first region and an edge of the substrate. The display pixels are disposed on the first region and the second region of the substrate. The sensing pixels are disposed on the first region of the substrate. The read-out circuit is electrically connected to the sensing pixels. A portion of the read-out circuit is disposed on the second region of the substrate and the portion of the read-out circuit is located between two display pixels of the display pixels.

8 Claims, 8 Drawing Sheets

(56) References Cited

U.S. PATENT DOCUMENTS

| | | | |
|---|---|---|---|
| 2015/0339985 A1* | 11/2015 | Hong | G06F 3/0412 |
| | | | 345/87 |
| 2016/0098140 A1* | 4/2016 | Lee | G06K 9/0002 |
| | | | 345/173 |
| 2018/0082100 A1 | 3/2018 | Hsieh et al. | |
| 2019/0114007 A1* | 4/2019 | Mugiraneza | G06F 3/0446 |
| 2019/0227652 A1* | 7/2019 | Kwon | G06F 3/04166 |
| 2019/0297282 A1* | 9/2019 | Tsutsui | H01L 27/146 |
| 2020/0159385 A1* | 5/2020 | Chung | G09G 3/20 |

FOREIGN PATENT DOCUMENTS

| | | |
|---|---|---|
| CN | 105975944 | 9/2016 |
| TW | I688899 | 3/2020 |

* cited by examiner

PIXEL ARRAY SUBSTRATE

CROSS-REFERENCE TO RELATED APPLICATION

This application claims the priority benefit of Taiwan patent application serial no. 108140713, filed on Nov. 8, 2019. The entirety of the above-mentioned patent application is hereby incorporated by reference here and made a part of this specification.

BACKGROUND OF THE INVENTION

1. Field of the Invention

The invention relates to a pixel array substrate, and in particular, to a pixel array substrate including sensing pixels.

2. Description of Related Art

Designs of a high screen-to-body ratio and a full screen have been mainstreams of specifications of small and medium-sized panels. To achieve the high screen-to-body ratio and the full screen, a plurality of sensing pixels used for fingerprint recognition may be integrated into a pixel array substrate of a display panel, to form an in-cell fingerprint panel. The in-cell fingerprint panel has a full-screen (which may also be referred to as non-fixed point) fingerprint recognition function, which may support various applications, and can improve user experience, and increase added value of the display panel. In the in-cell fingerprint panel, sensing signals of the plurality of sensing pixels need to be transmitted to an external processing circuit by using a read-out circuit. However, the read-out circuit needs to occupy an outer lead bonding (OLB) region of the display panel, adversely affecting a screen-to-body ratio of the display panel.

SUMMARY OF THE INVENTION

The invention provides a display device with good performance.

A pixel array substrate in the invention includes a substrate, a plurality of display pixels, a plurality of sensing pixels, and a read-out circuit. The substrate includes a first region and a second region. The second region is located between the first region and an edge of the substrate. The plurality of display pixels are disposed on the first region and the second region of the substrate. The plurality of sensing pixels are disposed on the first region of the substrate. The read-out circuit is electrically connected to the plurality of sensing pixels. A portion of the read-out circuit is disposed on the second region of the substrate, and the portion of the read-out circuit is located between two of the plurality of display pixels.

In an embodiment of the invention, each display pixel includes a data line, a scanning line, a transistor, and a pixel electrode. The transistor of the display pixel is electrically connected to the data line and the scanning line. The pixel electrode is electrically connected to the transistor of the display pixel. A light shielding pattern shields the scanning line of one of the two display pixels and the portion of the read-out circuit.

In an embodiment of the invention, the substrate further includes a third region located between the second region and the edge of the substrate. The pixel array substrate further includes a plurality of sensing fan-out lines electrically connected to the read-out circuit, and disposed on the third region of the substrate. At least one display pixel is located between the portion of the read-out circuit and the plurality of sensing fan-out lines.

In an embodiment of the invention, the portion of the read-out circuit includes at least one portion of a reset circuit.

In an embodiment of the invention, the portion of the read-out circuit includes at least one portion of an active load circuit.

In an embodiment of the invention, the portion of the read-out circuit includes at least one portion of a multiplexer.

In an embodiment of the invention, the pixel array substrate further includes a plurality of read-out lines electrically connected to the plurality of sensing pixels. The multiplexer includes a plurality of selection transistors. A plurality of first ends of the plurality of selection transistors of the multiplexer are electrically connected to the plurality of read-out lines. The portion of the read-out circuit includes the plurality of selection transistors of the multiplexer.

In an embodiment of the invention, the pixel array substrate further includes a plurality of read-out lines electrically connected to the plurality of sensing pixels. The multiplexer includes a plurality of selection transistors and a plurality of bus lines. A plurality of first ends of the plurality of selection transistors of the multiplexer are electrically connected to the plurality of read-out lines, and a plurality of second ends of the plurality of selection transistors of the multiplexer are electrically connected to the plurality of bus lines. The portion of the read-out circuit includes the plurality of bus lines.

In an embodiment of the invention, the pixel array substrate further includes a plurality of read-out lines electrically connected to the plurality of sensing pixels. The multiplexer includes a plurality of selection transistors and a plurality of bus lines. A plurality of first ends of the plurality of selection transistors of the multiplexer are electrically connected to the plurality of read-out lines respectively, and a plurality of second ends of the plurality of selection transistors of the multiplexer are electrically connected to the plurality of bus lines. The portion of the read-out circuit includes at least one of the plurality of bus lines and the plurality of selection transistors of the multiplexer.

BRIEF DESCRIPTION OF THE DRAWINGS

FIG. 3 corresponds to one first sub-region 112a in FIG. 2.

DESCRIPTION OF THE EMBODIMENTS

Figure 1:
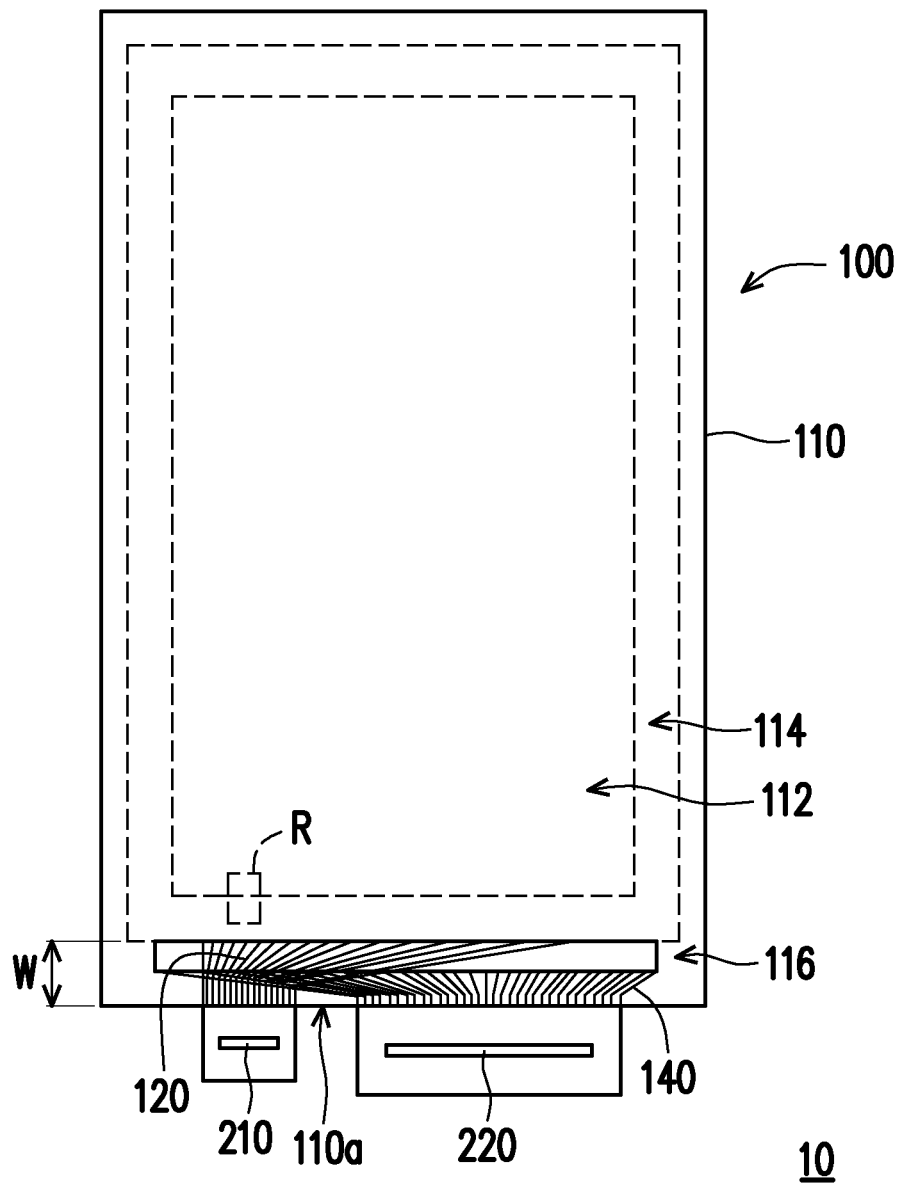
FIG. 1 is a schematic top view of a display device 10 according to an embodiment of the invention.

Exemplary embodiments of the invention are described in detail, and examples of the exemplary embodiments are shown in the accompanying drawings. Whenever possible, the same component symbols are used in the drawings and descriptions to indicate the same or similar parts.

It should be understood that when a component such as a layer, film, region or substrate is referred to as being "on" or "connected" to another component, it may be directly on or connected to the another component, or an intermediate component may exist. In contrast, when a component is referred to as being "directly on" or "directly connected to" another component, there is no intermediate component. As used herein, "connection" may refer to a physical and/or an electrical connection. Further, "electrical connection" or "coupling" may mean that there is another component between two components.

As used herein, "about", "approximately", or "substantially" is inclusive of the stated value and means within an acceptable deviation range of the particular value as determined by one of ordinary skills in the art, considering the discussed measurement and a particular quantity of errors associated with the measurement (i.e., the limitations of the measurement system). For example, "about" may mean within one or more standard deviations, or within ±30%, ±20%, ±10%, or ±5% of the stated value. Further, as used herein, "about", "approximately", or "substantially" may be used to select a more acceptable deviation range or standard deviation depending on optical properties, etch properties, or other properties, rather than applying one standard deviation to all properties.

Unless otherwise defined, all terms (including technical and scientific terms) used herein have the same meaning as commonly understood by one of ordinary skills in the art to which the present invention belongs. It will be further understood that terms such as those defined in commonly used dictionaries should be interpreted as having meanings consistent with their meanings in the context of the related art and the present invention and will not be interpreted in an idealized or overly formal sense unless expressly so defined herein.

FIG. 1 is a schematic top view of a display device 10 according to an embodiment of the invention.

FIG. 1 shows a substrate 110, sensing fan-out lines 120, display fan-out lines 140, an external processing circuit 210 electrically connected to the sensing fan-out lines 120, and an external processing circuit 220 electrically connected to the display fan-out lines 140, of the display device 10. Other components of the display device 10 are omitted. In addition, the external processing circuits 210 and 220 may also be integrated into a single component.

Figure 2:
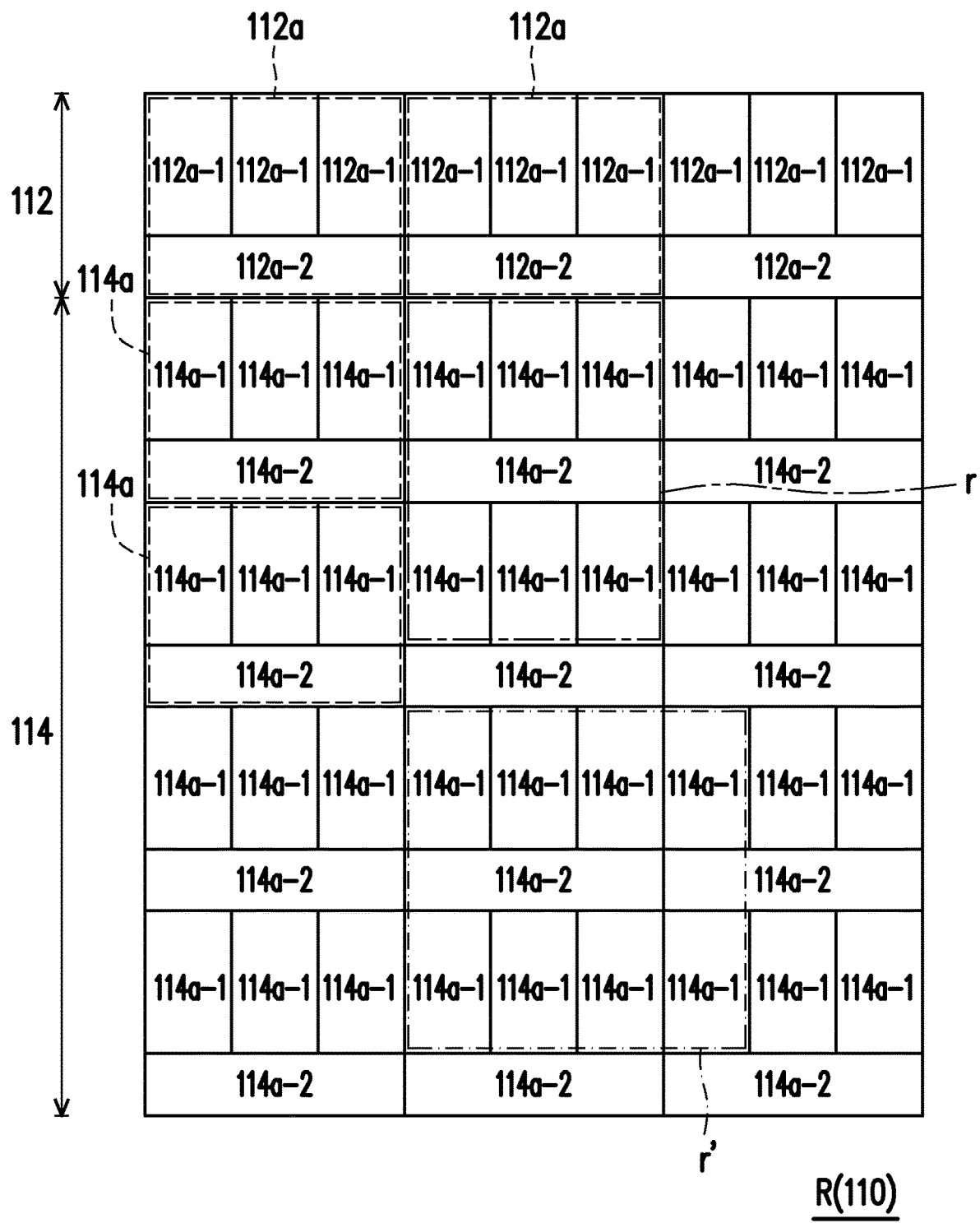
FIG. 2 is a schematic partial top view of a substrate 110 of a pixel array substrate 100 according to an embodiment of the invention.

FIG. 2 is a schematic partial top view of a substrate 110 of a pixel array substrate 100 according to an embodiment of the invention. FIG. 2 corresponds to a portion R in FIG. 1.

Figure 3:
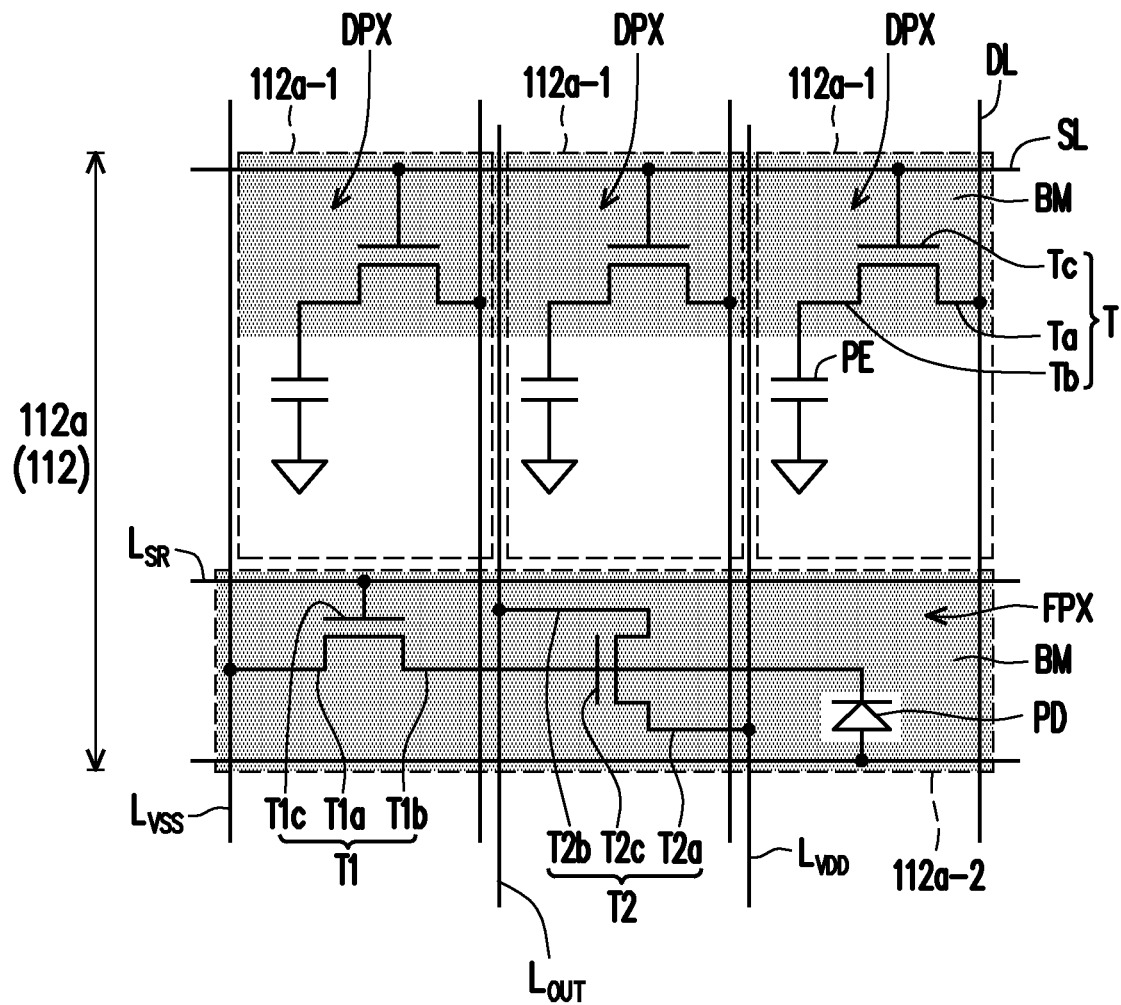
FIG. 3 shows at least one display pixel DPX and one sensing pixel FPX on one first sub-region 112a of a first region 112 of a substrate 110 according to an embodiment of the invention.

FIG. 3 shows at least one display pixel DPX and one sensing pixel FPX on one first sub-region 112a of a first region 112 of a substrate 110 according to an embodiment of the invention. FIG. 3 corresponds to one first sub-region 112a in FIG. 2.

Figure 4:
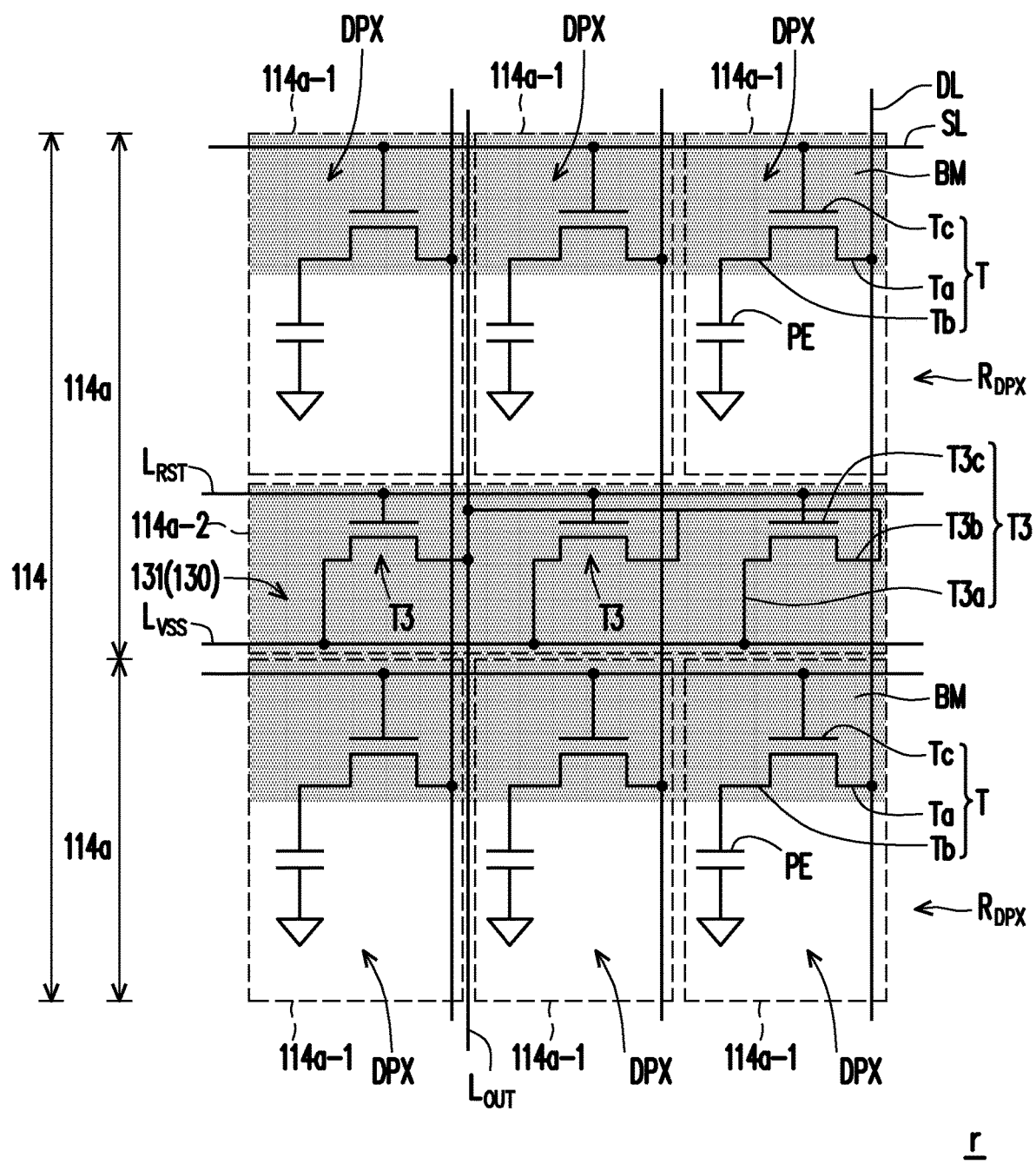
FIG. 4 shows a plurality of display pixels DPX on two adjacent second sub-regions 114a of a second region 114 of a substrate 110 and a portion of a read-out circuit 130 (for example, a reset circuit 131) on one of the two second sub-regions 114a according to an embodiment of the invention.

FIG. 4 shows a plurality of display pixels DPX on two adjacent second sub-regions 114a of a second region 114 of a substrate 110 and a portion (for example, a reset circuit 131) of a read-out circuit 130 on one of the two second sub-regions 114a according to an embodiment of the invention. FIG. 4 corresponds to a portion r in FIG. 2.

Figure 5:
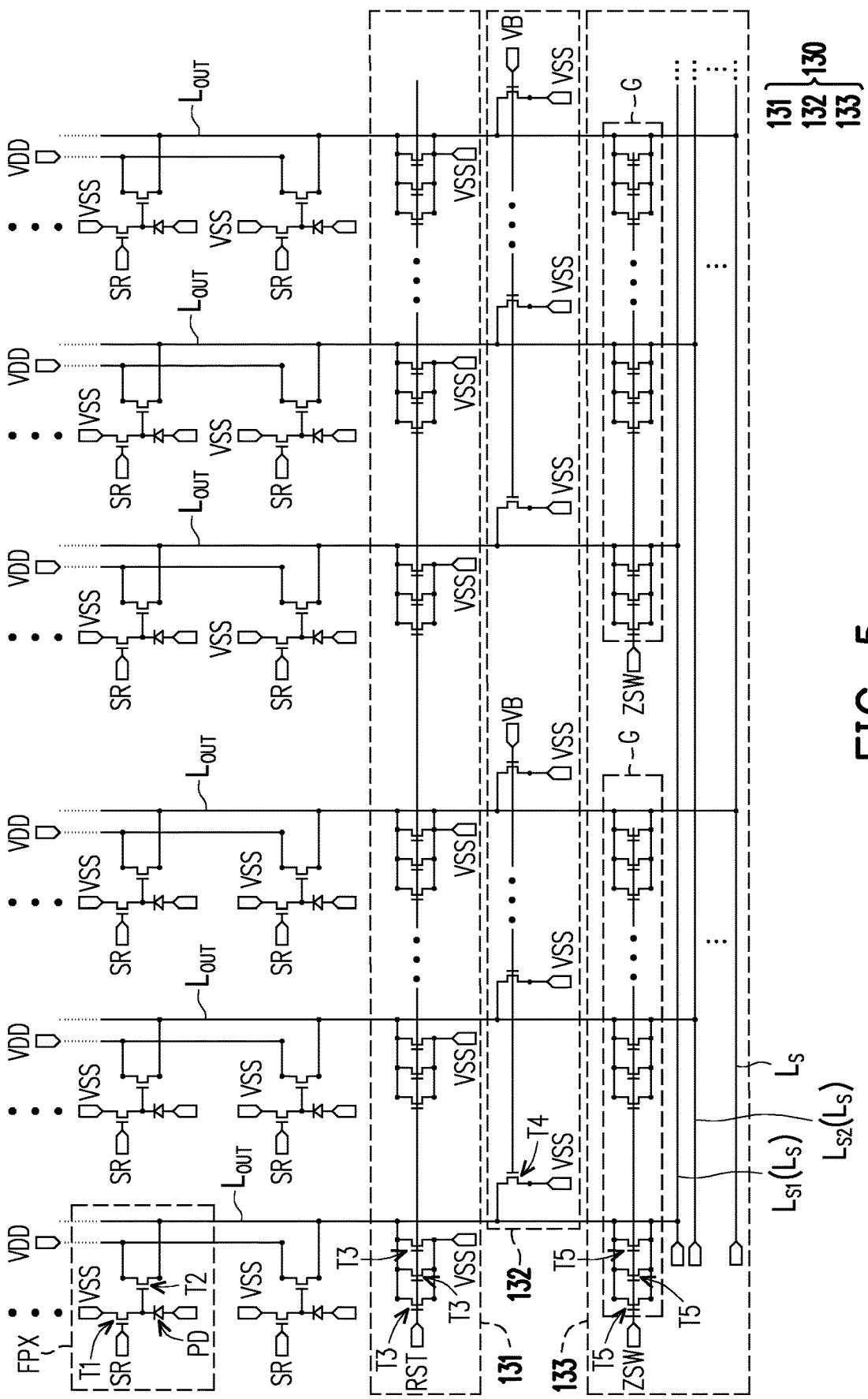
FIG. 5 is a schematic equivalent circuit diagram of a pixel array substrate 100 according to an embodiment of the invention.

FIG. 5 is a schematic equivalent circuit diagram of a pixel array substrate 100 according to an embodiment of the invention.

It needs to be noted that, the equivalent circuit diagram in FIG. 5 is used to describe an electrical connection relationship between components of the pixel array substrate 100. Positions of the components of the pixel array substrate 100 shown in FIG. 5 do not represent actual disposition positions of the components. For the disposition positions of the components of the pixel array substrate 100, refer to other figures.

Referring to FIG. 1, a display device 10 includes a pixel array substrate 100, an opposite substrate (not shown) relative to the pixel array substrate 100, and a display medium (not shown) disposed between the pixel array substrate 100 and the opposite substrate.

For example, in the present embodiment, the display medium may be a liquid crystal. However, the invention is not limited thereto. According to other embodiments, the display medium may alternatively be an organic light-emitting diode (OLED), a micro LED, a mini LED, a quantum dot LED, or other types of display mediums.

Referring to FIG. 1, the pixel array substrate 100 includes a substrate 110. The substrate 110 includes a first region 112 and a second region 114. The second region 114 is located between the first region 112 and an edge 110a of the substrate 110. The substrate 110 is mainly a component configured to carry the pixel array substrate 100. In the present embodiment, a material of the substrate 110 may be glass, quartz, organic polymer, or an opaque/reflective material (for example, wafer, ceramics, or other applicable materials), or other applicable materials.

Referring to FIG. 1 and FIG. 2, in the present embodiment, the first region 112 includes a plurality of first sub-regions 112a arranged in an array. Each first sub-region 112a includes at least one display pixel region 112a-1 and a sensing pixel region 112a-2. Referring to FIG. 2 and FIG. 3, the at least one display pixel region 112a-1 of each first sub-region 112a is configured to set at least one display pixel DPX. The sensing pixel region 112a-2 of each first sub-region 112a is configured to set a sensing pixel FPX. Referring to FIG. 1, in other words, the first region 112 is a main display and sensing region of the display device 10.

Referring to FIG. 1 and FIG. 2, in the present embodiment, the second region 114 includes a plurality of second sub-regions 114a arranged in an array. Each second sub-region 114a includes at least one display pixel region 114a-1 and a quasi-sensing pixel region 114a-2. Referring to FIG.

2 and FIG. 4, the at least one display pixel region 114a-1 of each second sub-region 114a is configured to set at least one display pixel DPX. The quasi-sensing pixel region 114a-2 of each second sub-region 114a is configured to set a portion of a read-out circuit 130 instead of a sensing pixel FPX. Referring to FIG. 1, in other words, the second region 114 is a display and quasi-sensing region of the display device 10.

Referring to FIG. 1, in the present embodiment, the substrate 110 of the pixel array substrate 100 further includes a third region 116. The third region 116 is located between the second region 114 and the edge 110a of the substrate 110. In the present embodiment, the pixel array substrate 100 further includes a plurality of sensing fan-out lines 120. The plurality of sensing fan-out lines 120 are electrically connected between the read-out circuit 130 (shown in FIG. 5) and a plurality of sensing pads (not shown), and the plurality of sensing pads are configured to bond with an external processing circuit 210. The pixel array substrate 100 further includes a plurality of display fan-out lines 140. The plurality of display fan-out lines 140 are electrically connected between a plurality of display pixels DPX and a plurality of display pads (not shown), and the plurality of display pads are configured to bond with an external processing circuit 220. The plurality of sensing fan-out lines 120, the plurality of sensing pads (not shown) configured to bond with the external processing circuit 210, the plurality of display fan-out lines 140, and the plurality of display pads (not shown) configured to bond with the external processing circuit 220 are disposed on the third region 116 of the substrate 110. In other words, the third region 116 of the substrate 110 is an OLB region of the display device 10.

Referring to FIG. 2, FIG. 3, and FIG. 4, a plurality of display pixels DPX are disposed on the first region 112 and the second region 114 of the substrate 110. Specifically, in the present embodiment, the plurality of display pixels DPX are disposed on a plurality of display pixel regions 112a-1 of the plurality of first sub-regions 112a of the display and sensing region (that is, the first region 112) and a plurality of display pixel regions 114a-1 of the plurality of second sub-regions 114a of the display and quasi-sensing region (that is, the second region 114).

Referring to FIG. 3, for example, in the present embodiment, each display pixel DPX may include a data line DL, a scanning line SL, a transistor T, and a pixel electrode PE. A first end Ta and a control end Tc of the transistor T of the display pixel DPX are electrically connected to the data line DL and the scanning line SL respectively. The pixel electrode PE is electrically connected to a second end Tb of the transistor T of the display pixel DPX.

Referring to FIG. 2 and FIG. 3, a plurality of sensing pixels FPX are disposed on the first region 112 of the substrate 110. Specifically, in the present embodiment, the plurality of sensing pixels FPX are disposed on a plurality of sensing pixel regions 112a-2 of the plurality of first sub-regions 112a of the display and sensing region (that is, the first region 112), and are not disposed on a plurality of quasi-sensing pixel regions 114a-2 of the plurality of second sub-regions 114a of the display and quasi-sensing region (that is, the second region 114). The plurality of sensing pixels FPX are disposed on most of the area of the display device 10, and are used for light sensing. For example, in the present embodiment, the plurality of sensing pixels FPX may be used for receiving a light beam reflected by a biological feature (for example, but not limited to, a fingerprint), thereby achieving almost full-screen biometric recognition.

Referring to FIG. 3 and FIG. 5, for example, in the present embodiment, each sensing pixel FPX may include a photosensitive element PD, a first transistor T1, a second transistor T2, a reference voltage line $L_{VSS}$ configured to provide a reference voltage VSS, a sensing scanning line $L_{SR}$ configured to provide a read voltage SR, a power supply line $L_{VDD}$ configured to provide a power supply voltage VDD, and a read-out line $L_{OUT}$ configured to receive a sensing output signal. A first end T1a of the first transistor T1 is electrically connected to the reference voltage line $L_{VSS}$, a control end T1c of the first transistor T1 is electrically connected to the sensing scanning line $L_{SR}$, and a second end T1b of the first transistor T1 is electrically connected to a control end T2c of the second transistor T2 and the photosensitive element PD. A first end T2a of the second transistor T2 is electrically connected to the power supply line $L_{VDD}$, and a second end T2b of the second transistor T2 is electrically connected to the read-out line $L_{OUT}$. However, the invention is not limited thereto. In other embodiments, the sensing pixels FPX may alternatively be other types of circuits. In addition, in the present embodiment, the photosensitive element PD may be a photodiode including silicon-rich oxide (SRO). However, the invention is not limited thereto.

Referring to FIG. 5, the pixel array substrate 100 further includes a read-out circuit 130 electrically connected to a plurality of read-out lines $L_{OUT}$ of the plurality of sensing pixels FPX. For example, in the present embodiment, the read-out circuit 130 may selectively include a reset circuit 131, an active load circuit 132, and a multiplexer 133. However, the invention is not limited thereto. In addition, it needs to be noted that, a type of the read-out circuit 130 shown in FIG. 5 is merely used to describe the invention rather than limit the invention. In other embodiments, the read-out circuit 130 may alternatively be of other types.

Referring to FIG. 2, FIG. 4, and FIG. 5, it should be noted that, a portion of the read-out circuit 130 is disposed on the second region 114 of the substrate 110, and the portion of the read-out circuit 130 is located between two display pixels DPX. In other words, the portion of the read-out circuit 130 is disposed on at least one quasi-sensing pixel region 114a-2.

Referring to FIG. 4, in the present embodiment, the plurality of display pixels DPX are arranged as a plurality of display pixel rows $R_{DPX}$. The portion of the read-out circuit 130 is located between two adjacent display pixel rows $R_{DPX}$. A light shielding pattern BM shields the scanning line SL of the display pixel DPX of one of the two display pixel rows $R_{DPX}$ and the portion of the read-out circuit 130. In other words, in the present embodiment, the portion of the read-out circuit 130 may be disposed below the light shielding pattern BM. The light shielding pattern BM is, for example, a portion, which overlaps the scanning line SL, of a black matrix. However, the invention is not limited thereto. The light shielding pattern BM may be disposed on the substrate 110 of the pixel array substrate 100, or may be disposed on the opposite substrate.

Referring to FIG. 1, FIG. 2, and FIG. 4, in the present embodiment, at least one display pixel DPX (for example, lower three display pixels DPX in FIG. 4) is located between the portion of the read-out circuit 130 (for example, but not limited to, the reset circuit 131 in FIG. 4) and the plurality of sensing fan-out lines 120 (shown in FIG. 1).

How the portion of the read-out circuit 130 may be disposed on the quasi-sensing pixel regions 114a-2 is described by way of example with reference to FIG. 4, FIG. 6, FIG. 7, and FIG. 8.

Referring to FIG. 2, FIG. 4, and FIG. 5, in an embodiment, at least one portion of the reset circuit 131 of the read-out circuit 130 may be disposed on the at least one quasi-sensing pixel region 114a-2, and located between the plurality of display pixels DPX. For example, the reset circuit 131 may include at least one reset transistor T3, a reset signal line $L_{RST}$ configured to provide a reset signal RST, and a reference voltage line $L_{VSS}$ configured to provide a reference voltage VSS. A first end T3a of each reset transistor T3 is electrically connected to the reference voltage line $L_{VSS}$, a control end T3c of each reset transistor T3 is electrically connected to the reset signal line $L_{RST}$, and a second end T3b of each reset transistor T3 is electrically connected to a corresponding read-out line $L_{OUT}$. Referring to FIG. 4, the at least one reset transistor T3, the reset signal line $L_{RST}$, and the reference voltage line $L_{VSS}$ of the read-out circuit 130 may be disposed on one of the quasi-sensing pixel regions 114a-2. However, the invention is not limited thereto.

In addition, it needs to be noted that, a quantity of reset transistors T3 of the reset circuit 131 that are electrically connected to a single read-out line $L_{OUT}$ is not specially limited. The quantity of the reset transistors T3 of the reset circuit 131 that are electrically connected to the single read-out line $L_{OUT}$ may be determined according to charging and discharging capacity requirements on the reset transistors T3 and a component size design space.

Figure 6:
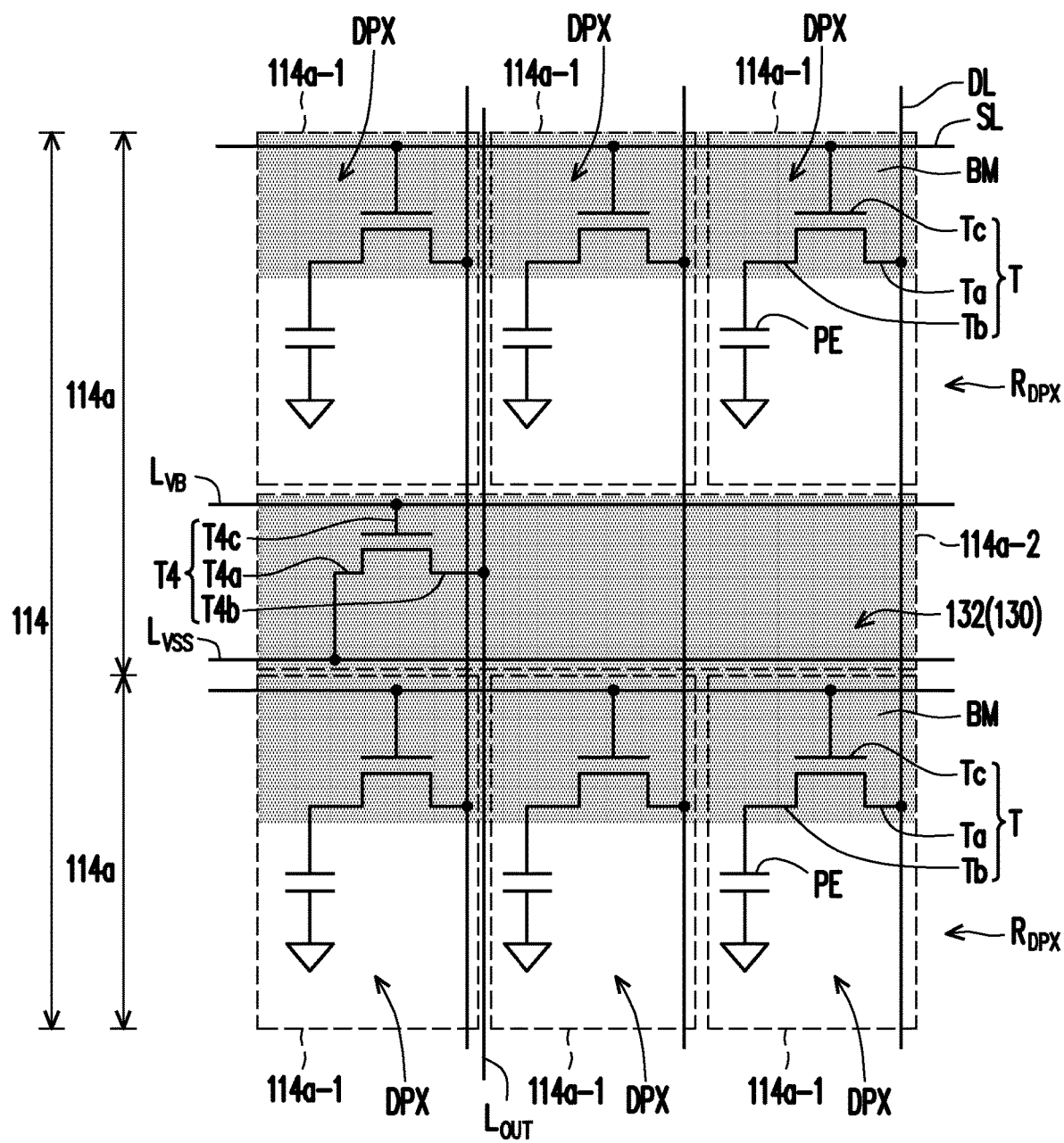
FIG. 6 shows a plurality of display pixels DPX on two adjacent second sub-regions 114a of a second region 114 of a substrate 110 and a portion of a read-out circuit 130 (for example, an active load circuit 132) on one of the two second sub-regions 114a according to an embodiment of the invention.

FIG. 6 shows a plurality of display pixels DPX on two adjacent second sub-regions 114a of a second region 114 of a substrate 110 and a portion of a read-out circuit 130 (for example, an active load circuit 132) on one of the two second sub-regions 114a according to an embodiment of the invention. FIG. 5 corresponds to a portion r in FIG. 2.

Referring to FIG. 2, FIG. 5, and FIG. 6, in an embodiment, at least one portion of the active load circuit 132 of the read-out circuit 130 may be disposed on the at least one quasi-sensing pixel region 114a-2, and located between the plurality of display pixels DPX. For example, in the present embodiment, the active load circuit 132 may include a load transistor T4 configured to form a resistance, a bias signal line $L_{VB}$ configured to provide a bias voltage VB, and a reference voltage line $L_{VSS}$ configured to provide a reference voltage VSS. A first end T4a of each load transistor T4 is electrically connected to the reference voltage line $L_{VSS}$, a control end T4c of each load transistor T4 is electrically connected to the bias signal line $L_{VB}$, and a second end T4b of each load transistor T4 is electrically connected to a corresponding read-out line $L_{OUT}$. Referring to FIG. 6, the load transistor T4, the bias voltage signal line $L_{VB}$, and the reference voltage line $L_{VSS}$ of the read-out circuit 130 may be disposed on one quasi-sensing pixel region 114a-2. However, the invention is not limited thereto.

Figure 7:
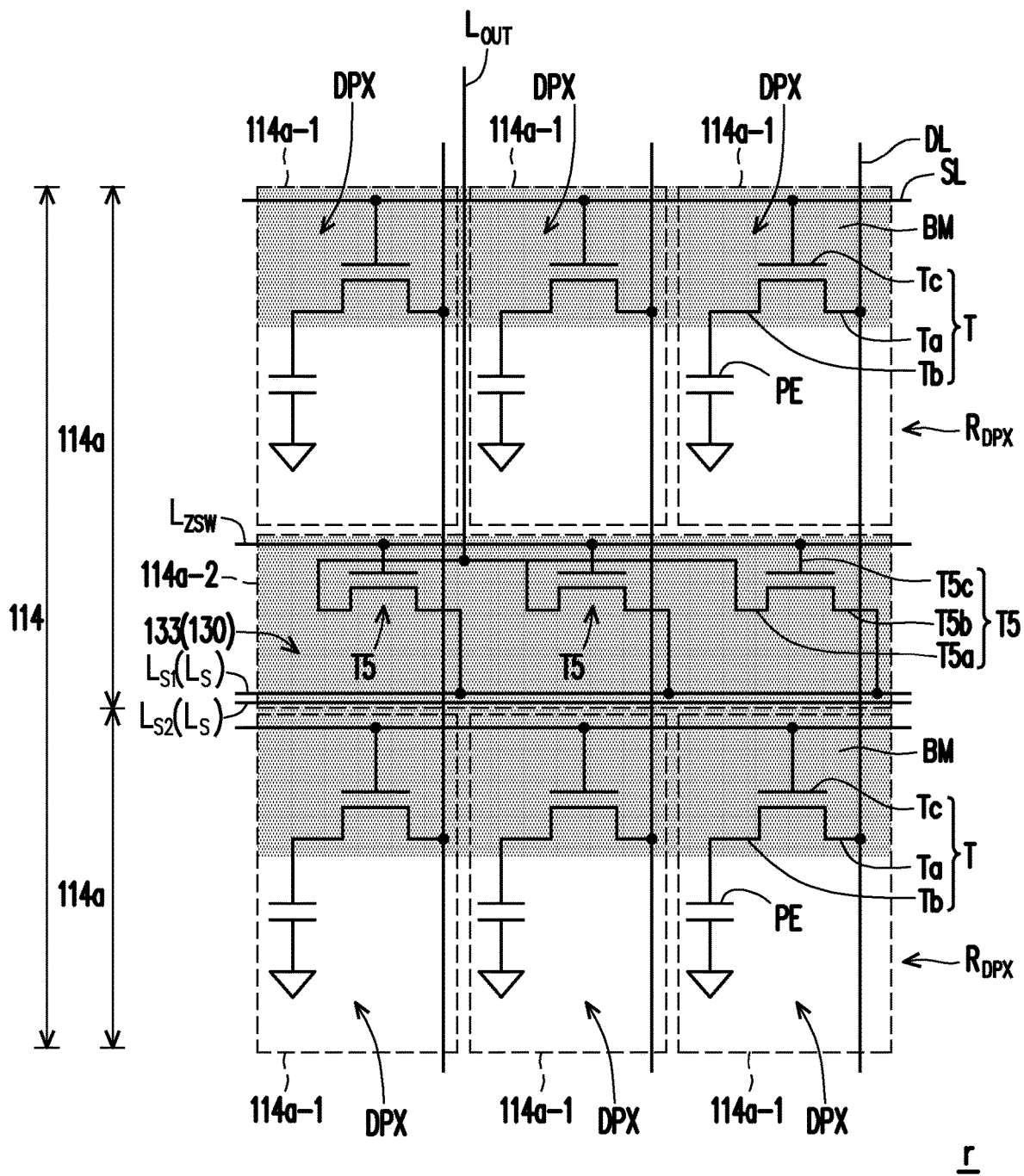
FIG. 7 shows a plurality of display pixels DPX on two adjacent second sub-regions 114a of a second region 114 of a substrate 110 and a portion of a read-out circuit 130 (for example, a portion of a multiplexer 133) on one of the two second sub-regions 114a according to an embodiment of the invention.

FIG. 7 shows a plurality of display pixels DPX on two adjacent second sub-regions 114a of a second region 114 of a substrate 110 and a portion of a read-out circuit 130 (for example, a portion of a multiplexer 133) on one of the two second sub-regions 114a according to an embodiment of the invention. FIG. 7 corresponds to a portion r in FIG. 2.

Referring to FIG. 2, FIG. 5, and FIG. 7, in an embodiment, at least one portion of the multiplexer 133 of the read-out circuit 130 may be disposed on the at least one quasi-sensing pixel region 114a-2, and located between the plurality of display pixels DPX. The multiplexer 133 may also be referred to as a zone-switch circuit. Referring to FIG. 5 and FIG. 7, for example, in the present embodiment, the multiplexer 133 includes n selection transistor groups G, n selection lines $L_{ZSW}$ configured to provide a multiplex signal ZSW, and m bus lines LS. The n selection transistor groups G are electrically connected to the n selection lines $L_{ZSW}$ respectively. A plurality of control ends T5c of a plurality of selection transistors T5 of each selection transistor group G are electrically connected to a same selection line $L_{ZSW}$, a plurality of first ends T5a of the plurality of selection transistors T5 of each selection transistor group G are electrically connected to a plurality of read-out lines $L_{OUT}$, and a plurality of second ends T5b of the plurality of selection transistors T5 of each selection transistor group G are electrically connected to the first to the $m^{th}$ bus lines $L_S$. n and m are positive integers greater than or equal to 2.

Referring to FIG. 5 and FIG. 7, in an embodiment, the plurality of selection transistors T5 of one selection transistor group G, one selection line $L_{ZSW}$, the first bus line $L_{S1}$, and the second bus line $L_{S2}$ of the multiplexer 133 may be disposed on one quasi-sensing pixel region 114a-2, and located between the plurality of display pixels DPX. However, the invention is not limited thereto.

In addition, it needs to be noted that, a quantity of selection transistors T5 of the multiplexer 133 that are electrically connected to a single read-out line $L_{OUT}$ is not specially limited. The quantity of the selection transistors T5 of the multiplexer 133 that are electrically connected to the single read-out line $L_{OUT}$ may be determined according to charging and discharging capacity requirements of on the selection transistors T5 and a component size design space.

Figure 8:
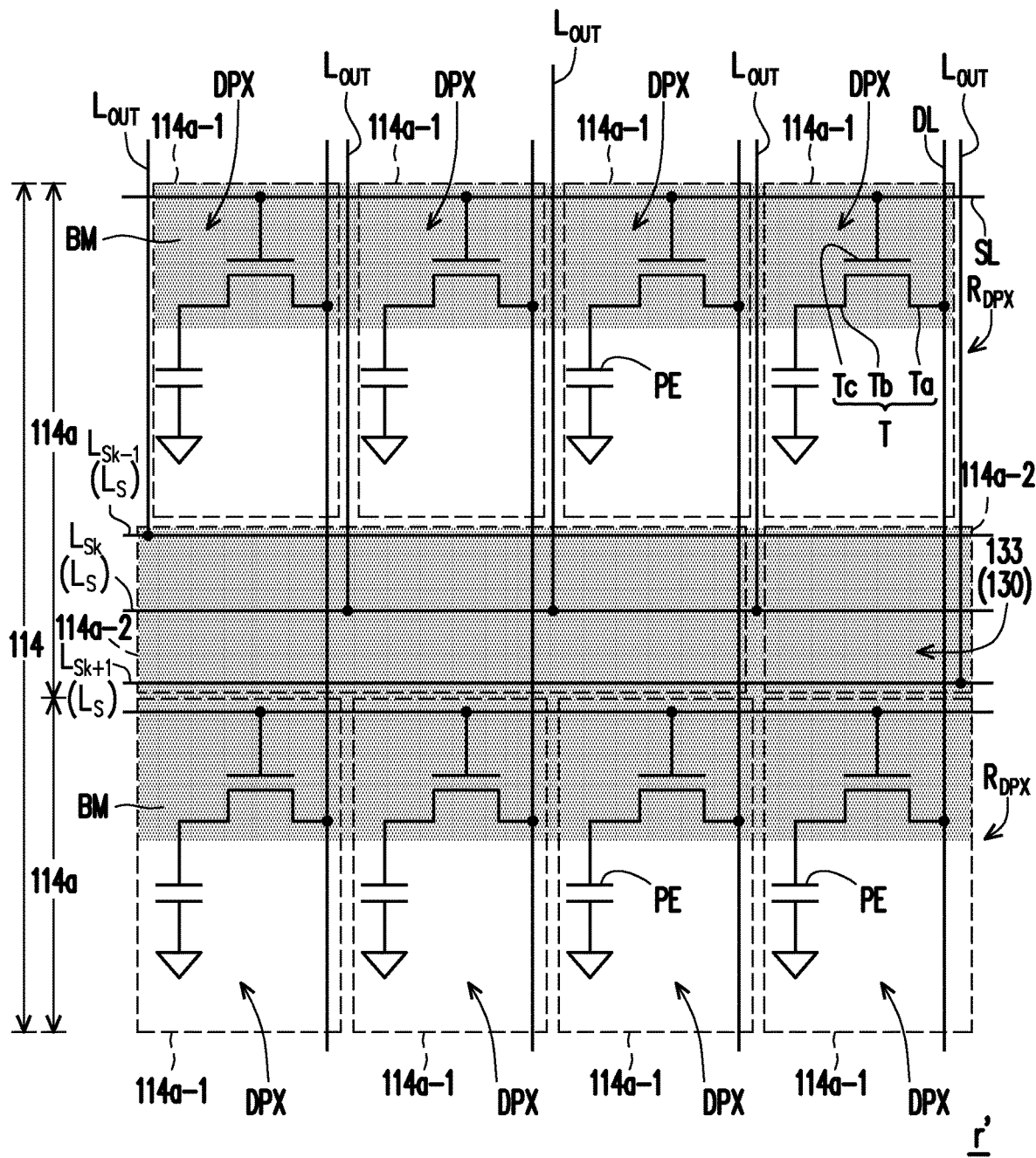
FIG. 8 shows a plurality of display pixels DPX on two adjacent second sub-regions 114a of a second region 114 of a substrate 110 and a portion of a read-out circuit 130 (for example, a portion of a multiplexer 133) on one of the two second sub-regions 114a according to an embodiment of the invention.

FIG. 8 shows a plurality of display pixels DPX on two adjacent second sub-regions 114a of a second region 114 of a substrate 110 and a portion of a read-out circuit 130 (for example, a portion of a multiplexer 133) on one of the two second sub-regions 114a according to an embodiment of the invention. FIG. 8 corresponds to a portion r' in FIG. 2.

Referring to FIG. 2, FIG. 5, and FIG. 8, in an embodiment, at least one portion of the multiplexer 133 of the read-out circuit 130 may be disposed on the at least one quasi-sensing pixel region 114a-2, and located between the plurality of display pixels DPX. Referring to FIG. 5 and FIG. 8, for example, in the present embodiment, the $(k-1)^{th}$ bus line $L_{Sk-1}$, the $k^{th}$ bus line $L_{Sk}$, and the $(k+1)^{th}$ bus line $L_{Sk+1}$ of the multiplexer 133 may be disposed on one quasi-sensing pixel region 114a-2, and located between the plurality of display pixels DPX. k is a positive integer greater than or equal to 2.

It should be noted that, in the foregoing embodiments, the portion of the read-out circuit 130 is disposed on the second region 114 of the substrate 110, and the portion of the read-out circuit 130 is located between the plurality of display pixels DPX. That is, at least one portion of the read-out circuit 130 is disposed on the at least one quasi-sensing pixel region 114a-2 of the display and quasi-sensing region (that is, the second sub-region 114a). Therefore, the at least one portion of the read-out circuit 130 does not need to be disposed on the third region 116 (that is, the OLB region) of the substrate 110, so that a width W (labeled in FIG. 1) of the third region 116 of the substrate 110 is reduced. Therefore, the display device 10 with a high screen-body ratio is achieved.

What is claimed is:

1. A pixel array substrate, comprising:
   a substrate, having a first region and a second region, wherein the second region is located between the first region and an edge of the substrate;

a plurality of display pixels, disposed on the first region and the second region of the substrate;

a plurality of sensing pixels, disposed on the first region of the substrate, wherein each of the sensing pixels comprises a photosensitive element, a first transistor, a second transistor, a first reference voltage line, a sensing scanning line, a power supply line, and a read-out line, a first end of the first transistor is electrically connected to the first reference voltage line, a control end of the first transistor is electrically connected to the sensing scanning line, a second end of the first transistor is electrically connected to t a control end of the second transistor and the photosensitive element, a first end of the second transistor is electrically connected to the power supply line, and a second end of the second transistor is electrically connected to the read-out line; and a read-out circuit, electrically connected to the sensing pixels, wherein the read-out circuit comprises at least one reset transistor, a reset signal line and a second reference voltage line, wherein a first end of the at least one rest transistor is electrically connected to the second reference voltage line, a control end of the at least one reset transistor is electrically connected to the reset signal line, and a second end of the at least one reset transistor is electrically connected to the read-out line of one of the sensing pixels corresponding thereto, wherein a portion of the read-out circuit is disposed on the second region of the substrate, the portion of the read-out circuit is located between two display pixels of the display pixels, and the portion of the read-out circuit comprises the at least one reset transistor, the reset signal line and the second reference signal line.

2. The pixel array substrate according to claim 1, wherein each of the display pixels comprises a data line, a scanning line, a transistor, and a pixel electrode, the transistor of the display pixel is electrically connected to the data line and the scanning line, the pixel electrode is electrically connected to the transistor of the display pixel, and a light shielding pattern shields the scanning line of one of the two display pixels and the portion of the read-out circuit.

3. The pixel array substrate according to claim 1, wherein the substrate further has a third region and the third region is located between the second region and the edge of the substrate, the pixel array substrate further comprising:

a plurality of sensing fan-out lines, electrically connected to the read-out circuit and disposed on the third region of the substrate, wherein at least one display pixel is located between the portion of the read-out circuit and the sensing fan-out lines.

4. The pixel array substrate according to claim 1, wherein the portion of the read-out circuit further comprises a load transistor, a bias signal line and a third reference voltage line, wherein a first end of the load transistor is electrically connected to the third reference voltage line, a control end of the load transistor is electrically connected to the bias signal line, and a second end of the load transistor is electrically connected to the read-out line of the one of the sensing pixels corresponding thereto.

5. The pixel array substrate according to claim 1, wherein the portion of the read-out circuit comprises at least one portion of a multiplexer.

6. The pixel array substrate according to claim 5, wherein the multiplexer comprises:

a plurality of selection transistors, wherein a plurality of first ends of the selection transistors of the multiplexer are electrically connected to the read-out lines; and the portion of the read-out circuit comprises the selection transistors of the multiplexer.

7. The pixel array substrate according to claim 5, wherein the multiplexer comprises:

a plurality of selection transistors, wherein a plurality of first ends of the selection transistors of the multiplexer are electrically connected to the read-out lines; and a plurality of bus lines, wherein a plurality of second ends of the selection transistors of the multiplexer are electrically connected to the bus lines; and the portion of the read-out circuit comprises the bus lines.

8. The pixel array substrate according to claim 5, wherein the multiplexer comprises:

a plurality of selection transistors, wherein a plurality of first ends of the selection transistors of the multiplexer are electrically connected to the read-out lines respectively; and a plurality of bus lines, wherein a plurality of second ends of the selection transistors of the multiplexer are electrically connected to the bus lines; and the portion of the read-out circuit comprises at least one of the bus lines and the selection transistors of the multiplexer.

* * * * *